United States Patent [19]
Bosselmann et al.

[11] Patent Number: 5,895,912
[45] Date of Patent: Apr. 20, 1999

[54] METHOD AND DEVICE FOR MEASURING AN ALTERNATING ELECTRIC QUANTITY WITH TEMPERATURE COMPENSATION BY FITTING

[75] Inventors: Thomas Bosselmann; Peter Menke, both of Erlangen, Germany

[73] Assignee: Siemens Aktiengesellschaft, München, Germany

[21] Appl. No.: 08/817,068

[22] PCT Filed: Sep. 26, 1995

[86] PCT No.: PCT/DE95/01332

§ 371 Date: Apr. 4, 1997

§ 102(e) Date: Apr. 4, 1997

[87] PCT Pub. No.: WO96/11409

PCT Pub. Date: Apr. 18, 1996

[30] Foreign Application Priority Data

Oct. 10, 1994 [DE] Germany .................. 44 36 181

[51] Int. Cl.⁶ .................................... G01R 33/032
[52] U.S. Cl. .................. 250/227.17; 324/96; 324/244.1
[58] Field of Search .............. 250/227.17; 324/96, 324/244.1, 105

[56] References Cited

U.S. PATENT DOCUMENTS

| | | | |
|---|---|---|---|
| 4,378,496 | 3/1983 | Brogardh et al. | 250/227 |
| 4,563,639 | 1/1986 | Langeac | 324/96 |
| 4,564,754 | 1/1986 | Sato et al. | |
| 4,683,421 | 7/1987 | Miller et al. | |
| 4,755,665 | 7/1988 | Ulmer, Jr. et al. | |
| 4,852,026 | 7/1989 | Berard | 364/556 |
| 4,933,629 | 6/1990 | Kozuka et al. | 324/96 |
| 4,973,899 | 11/1990 | Jones et al. | 324/96 |
| 5,053,617 | 10/1991 | Kakizaki et al. | |
| 5,111,135 | 5/1992 | Kozuka et al. | |
| 5,247,244 | 9/1993 | Miller et al. | |
| 5,382,901 | 1/1995 | Okajima et al. | 324/244.1 |
| 5,446,381 | 8/1995 | Okajima et al. | 324/96 |
| 5,475,298 | 12/1995 | Rogers | 324/96 |
| 5,656,934 | 8/1997 | Bosselmann | 324/96 |
| 5,764,046 | 6/1998 | Bosselmann | 324/96 |
| 5,811,964 | 9/1998 | Bosselmann et al. | 324/96 |

FOREIGN PATENT DOCUMENTS

| | | |
|---|---|---|
| 0 088 419 A1 | 9/1983 | European Pat. Off. |
| 0 108 012 A1 | 5/1984 | European Pat. Off. |
| 0 390 581 A2 | 10/1990 | European Pat. Off. |
| 0 410 234 A2 | 1/1991 | European Pat. Off. |
| 0 557 090 A2 | 8/1993 | European Pat. Off. |
| 0 586 226 A2 | 3/1994 | European Pat. Off. |
| 0 611 974 A1 | 8/1994 | European Pat. Off. |
| 28 35 794 | 2/1980 | Germany. |
| 33 26 736 C2 | 2/1984 | Germany. |

(List continued on next page.)

OTHER PUBLICATIONS

"High Accuracy Faraday Rotation Measurements", Proc. Conf. Opt. Fiber Sensors, OFS 1988, New Orleans, S. 288–291.

"An Optical Current Comparator For Absolute Current Measurement", Sensor and Actuators, A. 37–38, 1993, S. 571–576.

*Primary Examiner*—Edward P. Westin
*Assistant Examiner*—Thanh X. Luu
*Attorney, Agent, or Firm*—Kenyon & Kenyon

[57] ABSTRACT

Polarized measuring light is coupled into a sensor device and, after passing through the sensor device, is decomposed in an analyzer into two differently, linearly polarized partial light signals. The corresponding electric intensity signals are intensity-normalized by dividing their respective AC signal component by their respective DC signal component. From the two intensity-normalized signals S1 and S2, a temperature-compensated measured signal M is derived in accordance with the two equations $S1=f1(T)*M$ and $S2=f2(T)*M$. The functions $f1(T)$ and $f2(T)$ are predetermined by particular linear, quadratic, or exponential fit-functions of the temperature T. In particular, in the case of linear fit-functions $f1(T)$ and $f2(T)$, the measured signal is yielded as $M=A*S1+B*S2$.

10 Claims, 3 Drawing Sheets

FOREIGN PATENT DOCUMENTS

| | | |
|---|---|---|
| 34 04 608 A | 8/1984 | Germany . |
| 39 23 803 A1 | 1/1991 | Germany . |
| 39 23 804 A1 | 1/1991 | Germany . |
| 42 29 449 A1 | 3/1994 | Germany . |
| 43 04 762 A1 | 8/1994 | Germany . |
| 43 12 183 A1 | 10/1994 | Germany . |
| 43 12 184 A1 | 10/1994 | Germany . |
| WO 91/01501 | 2/1991 | WIPO . |

METHOD AND DEVICE FOR MEASURING AN ALTERNATING ELECTRIC QUANTITY WITH TEMPERATURE COMPENSATION BY FITTING

BACKGROUND INFORMATION

The present invention relates to a method and a device for measuring an alternating electric quantity. In this case, an alternating electric quantity is understood to be an electric quantity which varies with time and whose frequency spectrum lies above a predetermined frequency. In particular, the alternating quantity can be an alternating electric current, an alternating electric voltage, or even an alternating electric field.

Optical measuring methods and measuring devices for measuring electric quantities such as current, voltage, or field are known, in which the change in polarization of polarized measuring light in a sensor device as a function of the electric quantity is evaluated. In this case, the magneto-optical Faraday effect is used for measuring an electric quantity; for measuring electric voltages and fields, on the other hand, the electro-optical Pockels effect is used.

The Faraday effect is understood to be the rotation of the plane of polarization of linearly polarized light as a function of a magnetic field. The angle of rotation is, in this case, proportional to the path integral over the magnetic field along the path traced by the light, with the Verdet constants as constants of proportionality. The Verdet constant depends on the material in which the light runs and on the wavelength of the light. To measure an electric current in a current conductor using the Faraday effect, a Faraday element, which consists of an optically transparent material, such as glass, is arranged as a sensor device in the vicinity of the current conductor. Linearly polarized light is sent through the Faraday element. The magnetic field generated by the electric current effects a rotation of the plane of polarization of the light in the Faraday element around an angle of rotation. The angle of rotation can be evaluated by an evaluation unit as a measure of the intensity of the magnetic field and thus of the strength of the electric current. In general, the Faraday element surrounds the current conductor, so that the polarized light circulates around the current conductor in a quasi-closed path. In this case, the amount of the angle of rotation of the polarization is, to a good approximation, directly proportional to the amplitude of the measured current.

WO 91/01501 discloses an optical measuring device for measuring an electric current, having a Faraday element which is designed as part of an optical monomode fiber. The Faraday element surrounds the current conductor in the form of a measuring winding.

EP-B-0 088 419 discloses an optical measuring device for measuring a current, in which the Faraday element is designed as a solid glass ring around the current conductor.

The electro-optical Pockels effect is understood to be the change in the polarization of polarized measuring light in a material exhibiting the Pockels effect as a result of a linear birefringence that is induced in the material. On the basis of the electro-optical coefficients, the pockels effect is essentially linearly dependent on an electric field penetrating the material. To measure an electric field, a Pockels element made of a material showing the Pockels effect is arranged in the electric field as a sensor device. To measure an electric voltage, the voltage to be measured is applied to two electrodes assigned to the Pockels element and the corresponding, adjacent, electric field is measured. Polarized measuring light is transmitted through the Pockels element, and the change in polarization of the polarized measuring light as a function of the voltage to be measured or of the field to be measured is evaluated with the aid of a polarization analyzer.

In order to measure a current using a Faraday element and a voltage using a Pockels element, a polarizing beam splitter or a simple beam splitter with two polarizers arranged downstream can be provided as a polarization analyzer (EP-B-0 088 419 and DE-C-34 04 608). The polarizing beam splitter may comprise a Wollaston prism. The polarized measuring light which has passed through the sensor device is split in the analyzer into two linearly polarized, partial light beams A and B with planes of polarization which are different and generally directed at right angles to each other.

Each of these two partial light signals A and B is converted in each case by a photoelectric transducer into electric signals PA and PB.

In optical measuring methods and measuring devices, the polarization change of polarized measuring light in a sensor element, which is influenced by the measured quantity, is used as a measuring effect. A problem in such devices is presented by the sensitivities of the optical materials of the sensor element and of the optical transmission paths to temperature changes or to mechanical stresses which, for example, are brought about by bending or vibrations. In particular, in the case of changes in the system temperature, the temperature sensitivity leads to an undesired change in the operating point and in the measuring sensitivity (response to temperature changes).

Various temperature compensation methods are already known for compensating temperature influences.

A temperature compensation method for a magneto-optical measuring device for measuring alternating currents is known from Proc. Conf. Opt. Fiber Sensors OFS 1988, New Orleans, pages 288 to 291, and the associated U.S. Pat. No. 4,755,665. In this method the two electric signals PA and PB belonging to the partial light signals A and B of the measuring light are each decomposed in a filter into their DC components, PA(DC) or PB(DC), and their AC components, PA (AC) or PB (AC). From the AC component PA(AC) or PB(AC) and the DC component PA(DC) or PB(DC), for each signal PA and PB, in order to compensate for different intensity fluctuations (attenuations) in the two transmission paths for the light signals A and B, the quotient QA=PA(AC)/PA(DC) or QB=PB(AC)/PB(DC) is formed from its AC component PA(AC) or PB(AC) and its DC component PB(DC) or PA(DC). From each of these two quotients QA and QB, a mean time value MW(QA) and MW(QB) is formed, and from these two mean values MW(QA) and MW(QB) a quotient Q=MW(QA)/MW(QB) is finally formed. Within the framework of an iteration process, a correction factor K is obtained for the determined quotient Q by means of comparison with calibrated values stored in a value table (look-up table). The value Q*K, corrected by this correction factor K, is used as a temperature-compensated measured value for an electric alternating current to be measured. Using this method, the temperature sensitivity can be reduced to approximately 1/50.

EP-A-0 557 090 discloses a temperature-compensation method for an optical measuring device for measuring magnetic alternating fields. This method uses the Faraday effect and is therefore also suitable for measuring electric alternating currents. In the case of this known method, once again the linearly polarized measuring light, after passing through the Faraday element, is split in an analyzer into two differently, linearly polarized partial light signals A and B. In order, to normalize the intensity, for each of the two associated electric signals PA and PB, the quotient QA=PA(AC)/PA(DC) or QB=PB(AC)/PB(DC) is formed separately from its associated AC component PA(AC) or PB(AC) and its associated DC component PA(DC) or PB(DC). In a computing unit, a measured signal $M=1/((\alpha/QA)-(\beta/QB))$ is now formed from the two quotients QA and QB, in which the real constants $\alpha$ and $\beta$ fulfill the relationship $\alpha+\beta=1$. This measured signal M is described as largely independent of changes in the Verdet constants and the circular birefringence in the Faraday element caused by temperature changes. Nothing is said about compensation of the temperature-induced linear birefringence.

EP-A-0 486 226 discloses a corresponding temperature compensation method for an optical measuring device for measuring an electric alternating voltage. An optical series circuit is connected optically between a light source and an evaluation unit. The optical series circuit consists of a polarizer, $\lambda/4$-plate, a Pockels element, and a polarized beam splitter. The beam splitter is used as an analyzer. The order of $\lambda/4$-plate and Pockels element in the optical series circuit can, however, also be exchanged. The measuring light from the light source is linearly polarized in the polarizer and, after passing through the Pockels element, is split in the analyzer into two partial light signals A and B having different planes of polarization. Each of these partial light signals A and B is converted into a corresponding electric intensity signal PA or PB. Thereupon, for normalizing the intensity for each of these two electric intensity signals PA and PB, the quotient QA=PA(AC)/PA(DC) or QB=PB(AC)/PB(DC) is formed from its associated AC signal component PA(AC) or PB(AC) and its associated DC signal component PA(DC) or PB(DC). From the two intensity-normalized quotients QA and QB, a measured signal $M=1/((\alpha/QA)-(\beta/QB))$ is now formed with the real constants $\alpha$ and $\beta$ in a computing unit. By matching these constants $\alpha$ and $\beta$, the measured signal M becomes largely independent of linear birefringence in the $\lambda/4$-plate caused by temperature changes.

SUMMARY OF THE INVENTION

An object of the invention is now to specify a method and a device for measuring an electric alternating quantity, in which influences of temperature changes and of intensity fluctuations on the measured signal are largely compensated.

As in achieving this object, polarized measuring light is coupled by means of input coupling means into an optical sensor device that is influenced by the alternating electric quantity. Upon passing through the sensor device, the polarization of the measuring light is changed as a function of the electric alternating quantity. After passing through the sensor device at least once, the measuring light is split by an analyzer into two linearly polarized, partial light signals having different planes of polarization. Subsequently, these two partial light signals are each converted into corresponding electric intensity signals by opto-electric receivers. Each of these two intensity signals is separately intensity-normalized in that the quotient signal is formed by normalizing means from its associated AC signal component and its associated DC signal component. In this manner, intensity fluctuations in the optical input coupling means and in the transmission paths for the two partial light signals can be compensated. From the two quotient signals, as intensity-normalized signals S1 and S2, a measured signal M, which is largely independent of the temperature T in the system, is now derived for the alternating electric quantity by evaluation means in accordance with the two equations $$S1 = f1(T) * M \tag{1}$$

$$S2 = f2(T) * M \tag{2},$$

in which f1 (T) and f2 (T) are predetermined fit-functions of the temperature T.

The fit-functions f1(T) and f2(T) represent theoretical approximations (fitting) for the temperature dependencies of the two intensity-normalized signals S1 and S2 and can, in particular, be polynomials of order n with $n \geq 1$, or else exponential functions of the temperature T. The outlay for calibration measurements can be appreciably reduced by means of this fitting.

Measurements have shown that even the simplest polynomials for n=1 (linear functions f1 (T) and f2 (T)) or n=2 (quadratic functions f1 (T) and f2(T)), in conjunction with the equations (1) and (2) for the temperature dependencies of the two intensity-normalized signals S1 and S2, represent an excellent approximation.

In the case of linear fit-functions $$f1(T) = a0 + a1 \cdot T \tag{3}$$

$$f2(T) = b0 + b1 \cdot T \tag{4}$$

with the real coefficients a0, a1, b0 and b1. By substituting the equations (3) and (4) into the equations (1) and (2) and solving for M, there results a measured signal which is linearly dependent on the two intensity-normalized signals S1 and S2

$$M = A * S1 + B * S2 \tag{5}$$

with the coefficients $$A = b1/(a0 \cdot b1 - a1 \cdot b0)$$

$$B = -a1/(a0 \cdot b1 - a1 \cdot b0).$$

In the case of quadratic fit-functions $$f1(T) = c0 + c1 \cdot T + c2 \cdot T^2 \tag{6}$$

$$f2(T) = d0 + d1 \cdot T + d2 \cdot T^2 \tag{7}$$

of the temperature T, by substituting the equations (6) and (7) into the equations (1) and (2) and solving for M, the expression $$M = (1/G) * (A' * S1 + B' * S2 \pm C * (D * S1^2 + E * S1 * S2 + F * S2^2)^{1/2}) \tag{8}$$

results for the measured signal M. The real coefficients A', B', C, D, E, F and G in equation (8) are clearly linked here to the coefficients c0, c1, c2 and d0, d1, d2 in equations (6) and (7) in the following way:

$$A' = c2 \cdot d1^2 - 2 \cdot c2 \cdot d0 \cdot d2 - c1 \cdot d1 \cdot d2 + 2 \cdot c0 \cdot d2^2$$

$$B' = 2 \cdot c2^2 \cdot d0 - c1 \cdot c2 \cdot d1 + C1^2 \cdot d2 - 2 \cdot c0 \cdot c2 \cdot d2$$

$$C = c2 \cdot d1 - c1 \cdot d2$$

$$D = d1^2 - 4 \cdot d0 \cdot d2$$

$$E = 4c2 \cdot d0 - 2 \cdot c1 \cdot d1 + 4c0d2$$

$$F = c1^2 - 4c0c2$$

$$G = 1/(2 \cdot (c2^2 \cdot d0 - c1 \cdot c2 \cdot d0 \cdot d1 + c0 \cdot c2 \cdot d1^2 + c1^2 \cdot d0 \cdot d2 - 2 \cdot c0 \cdot c2 \cdot d0 \cdot d2 - c0 \cdot c1 \cdot d1 \cdot d2 + a0^2 \cdot b2^2))$$

The sign in front of the square-root expression $C*(D*S1^2+E*S1*S2+F*S2^2)^{1/2}$ in equation (8) results from the physical-technical relationship and is especially dependent on the temperature range for the temperature T in which the measured signal M is intended to be compensated.

On the other hand, if one selects exponential fit-functions $$f1(T)=g1 \cdot exp(h1 \cdot T) \qquad (9)$$

$$f2(T)=g2 \cdot exp(h2 \cdot T) \qquad (10)$$

with the exponential function exp and the real co-efficients g1, g2, h1 and h2, the measured signal M results from the two intensity-normalized signals S1 and S2 in accordance with $$M=((1/g1)*S1)^{\gamma+1}*((1/g2)*S2)^{-\gamma} \qquad (11),$$

where the coefficient γ in both the exponents is in relation to the coefficients h1 and h2 in equations (9) and (10) in accordance with $$\gamma=h1/(h2-h1).$$

In the notation, "*" denotes a multiplication of signals and "·" a multiplication of real numbers.

BRIEF DESCRIPTION OF THE DRAWINGS

Mutually corresponding parts are provided with the same reference symbols.

DETAILED DESCRIPTION

Figure 1:
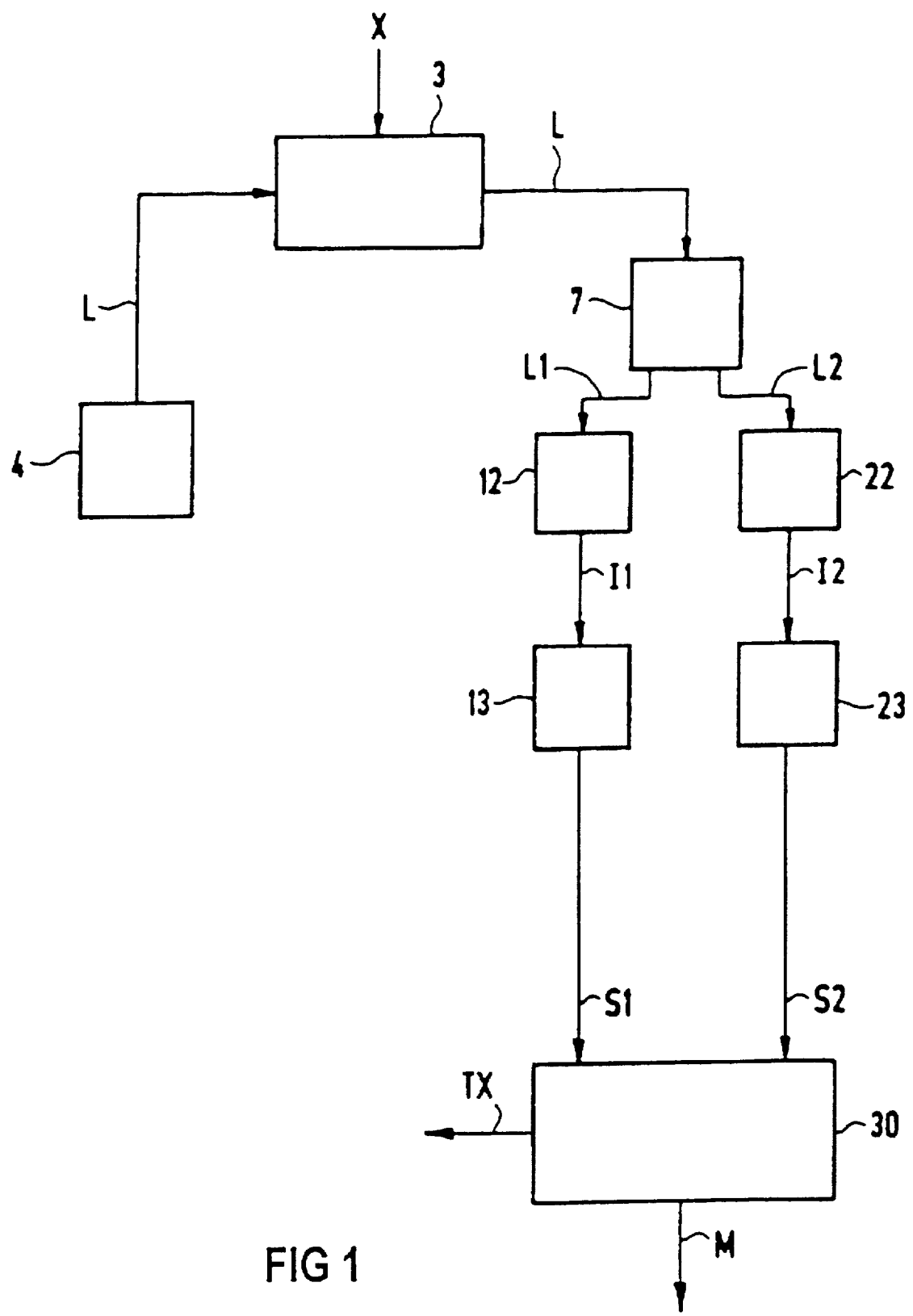
FIG. 1 illustrates schematically a basic construction of a device for measuring an electric alternating quantity.

FIG. 1 shows one specific embodiment of the measuring device for measuring an electric alternating quantity X in a basic construction. A sensor device 3 is provided which, under the influence of the electric alternating quantity X, changes the polarization of polarized measuring light L, irradiated into sensor device 3, as a function of the alternating electric quantity X. Sensor device 3 can be a Faraday sensor device for measuring an electric alternating current or a magnetic alternating field using the magneto-optic Faraday effect, or a Pockels sensor device for measuring an electric alternating voltage or an electric alternating field using the electro-optical Pockels effect. Polarized measuring light L is coupled into sensor device 3. To generate this polarized measuring light L, a light source 4 and associated polarizing means, not shown, or a self-polarizing light source 4, for example a laser diode, and, if necessary, additional polarizing means, not shown, can be provided. The polarized measuring light L passes through sensor device 3 at least once and, in so doing, experiences a change in its polarization dependent on the electric alternating quantity X. After passing through sensor device 3, the measuring light L is fed to an analyzer 7 and decomposed in analyzer 7 into two linearly polarized, partial light signals L1 and L2 having planes of polarization that are different from each other. Preferably, the planes of polarization of the two partial light signals L1 and L2 are directed at right angles to each other (orthogonal decomposition). A splitter, can be provided as the analyzer 7. The simple beam splitter includes a partially transparent mirror and two downstream polarizing filters crossed by a corresponding angle, preferably by 90°. Sensor device 3 and analyzer 7 can be optically connected to each other by way of a free beam arrangement or even via a polarization-maintaining optical waveguide, preferably a monomode optical fiber such as, for example, a HiBi (high birefringence) fiber or a polarization-neutral LoBi (low birefringence) fiber.

The two partial light signals L1 and L2 are then each fed to a photoelectric transducer 12 and 22, respectively. The transmission of the two partial light signals L1 and L2 from analyzer 7 to the respective associated transducer 12 or 22 can be carried out through a free-beam arrangement or, in each case, via an optical waveguide. In the transducers 12 and 22, the two partial light signals L1 and L2 are each converted into an electric intensity signal I1 or I2, which is a measure of the intensity of the associated partial light signal L1 and L2 respectively.

The two electric intensity signals I1 and I2 are each fed to an input of associated normalizing means 13 or 23. From the associated intensity signal I1 and I2, the normalizing means 13 and 23 in each case form an intensity-normalized signal S1 or S2, which corresponds to the quotient S1=A1/D1 (or S1=D1/A1) or S2=A2/D2 (or S2=D2/A2) from an AC signal component A1 or A2 and a DC signal component D1 or D2 of the associated intensity signal I1 and I2 respectively. The two intensity-normalized signals S1 and S2 are essentially independent of intensity changes of light source 4 and in the optical transmission path for the measuring light L and the two partial light signals L1 and L2. Different intensity changes in the two optical transmission paths for the partial light signals L1 and L2 are also compensated by means of this intensity normalization. A multimode fiber can therefore also be provided in each case as transmission paths for the two partial light signals L1 and L2.

However, a problem is now presented by changes in the temperature, which can result in a displacement of the operating point and a change in the measuring sensitivity of the measuring device. These temperature-induced measuring errors are now essentially eliminated by means of a temperature-compensation method described in the following.

For the purpose of temperature compensation, the two intensity-normalized signals S1 and S2 are fed to evaluation means 30. Evaluation means 30 derives, from the two intensity-normalized signals S1 and S2, a measured signal M, which is largely independent of temperature, for the alternating electric quantity X as a function M(S1, S2) of the two intensity-normalized signals S1 and S2. The measured signal M is supplied from an output of evaluation means 30. The basic function M(S1, S2) is determined by means of the two equations already mentioned $$S1=f1(T)*M \qquad (1)$$

and $$S2=f2(T)*M \qquad (2).$$

These equations are based on the assumption that the two intensity-normalized signals S1 and S2 can each be represented as a product of a function f1 (T) or f2(T) of the temperature and a temperature-independent signal M (factorizing). The two functions f1 (T) and f2 (T), characterizing the temperature dependency, are in this case predetermined fit-functions over a pre-selected temperature interval for the temperature T in the optical system and are so selected that equations (1) and (2) in this temperature interval can be solved for the measured signal M in a manner which is physically unequivocal.

In one specific embodiment, polynomials of nth order having the natural number n, preferably linear or quadratic functions f1(T) and f2(T) in accordance with equations (3) and (4), or (6) and (7), can be used as fit-functions f1(T) and f2(T). It has been shown that, even using the comparatively simple linear and quadratic interpolation functions f1(T) and f2(T) in accordance with equations (3) and (4), or (6) and (7), a good approximation of the measured temperature dependency is achieved. In the case of linear functions f1(T) and f2(T), the measured signal M=M (S1, S2) is determined in accordance with the equation already mentioned $$M = A*S1 + B*S2 \tag{5}$$

with the real coefficients A and B; in the case of quadratic functions f1(T) and f2(T), on the other hand, the measured signal is determined in accordance with the previously described equation $$M = (1/G)*(A'*S1 + B'*S2 \pm C*(D*S1^2 + E*S1*S2 + F*S2^2)^{1/2}) \tag{8}$$

with the real coefficients A', B', C, D, E, F and G. In the case of polynomials of order n higher than 2 for the functions f1(T) and f2(T), correspondingly more complicated expressions result for the measured signal M.

In another embodiment, using exponential fit functions f1(T) and f2(T) in accordance with equations (9) and (10), the measured signal M is derived by evaluation means 30 from the two intensity-normalized signals S1 and S2 in accordance with $$M = ((1/g1)*S1)^{\gamma+1}*((1/g2)*S2)^{-\gamma} \tag{11}$$

with the already defined real coefficients g1, g2 and γ.

To determine the measured signal M, in particular in accordance with equations (5), (8) or (11), evaluation means 30 can contain an analog/digital converter for digitizing the two intensity-normalized signals S1 and S2 and a digital signal processor (DSP) or a microprocessor for the digital calculation of the measured signal M from the digitized signals S1 and S2. In particular for the comparatively simple calculation of the measured signal M as a linear function of the two intensity-normalized signals S1 and S2 in accordance with equation (5), evaluation means 30 can also contain analog arithmetic components, however. The products A*S1 and B*S2 can be formed with the aid of amplifiers which amplify the signal S1 or S2 applied to their respective input by the gain factor set to the coefficients A or B. The sum of the two products A*S1 and B*S2 is then formed by an adder and can be output as a measured signal M. Using analog components, the temperature compensation can be carried out particularly quickly. In addition, evaluation means 30 can also contain at least one previously determined value storage, not shown, in which a pair of values (S1, S2) of the two intensity-normalized signals S1 and S2 are assigned an associated temperature-compensated measured signal M as a function M(S1, S2) of the two intensity-normalized signals S1 and S2. The value storage can contain a corresponding value table or even a corresponding calibration function.

In one advantageous specific embodiment, apart from the measured signal M for the alternating electric quantity X, evaluation means 30 also derives, from the two intensity-normalized signals S1 and S2, a temperature measured value TX for the temperature T with the aid of the two equations (1) and (2) and the respectively predetermined fit-functions f1 (T) and f2 (T). This temperature measured value TX is then present at an output of evaluation means 30.

In the case of linear fit-functions f1(T) and f2(T) in accordance with equations (3) and (4), there results, for example using equations (1) and (2), a temperature measured value $$TX = (b0*S1 - a0*S2)/(a1*S1 + b1*S2) \tag{12}$$

In the case of exponential fit-functions f1(T) and f2(T) in accordance with equations (9) and (10), the temperature measured value TX is calculated in accordance with $$TX = (1/(h1-h2))*\ln((g2*S1)/(g1*S2)) \tag{13}$$

with the natural logarithm function ln.

The measured signal M is linked to the temperature measured value TX through the equations $$M = S1/f1(TX) = S2/f2(TX) \tag{14}$$

The measured signal M can therefore also be derived by first deriving a temperature measured value TX from equations (1) and (2) with predetermined functions f1(T) and f2(T), and then, from one of the two intensity-normalized signals S1 or S2 and the associated function value f1(TX) or f2M), the measured signal M is determined in accordance with equation (14).

Figure 2:
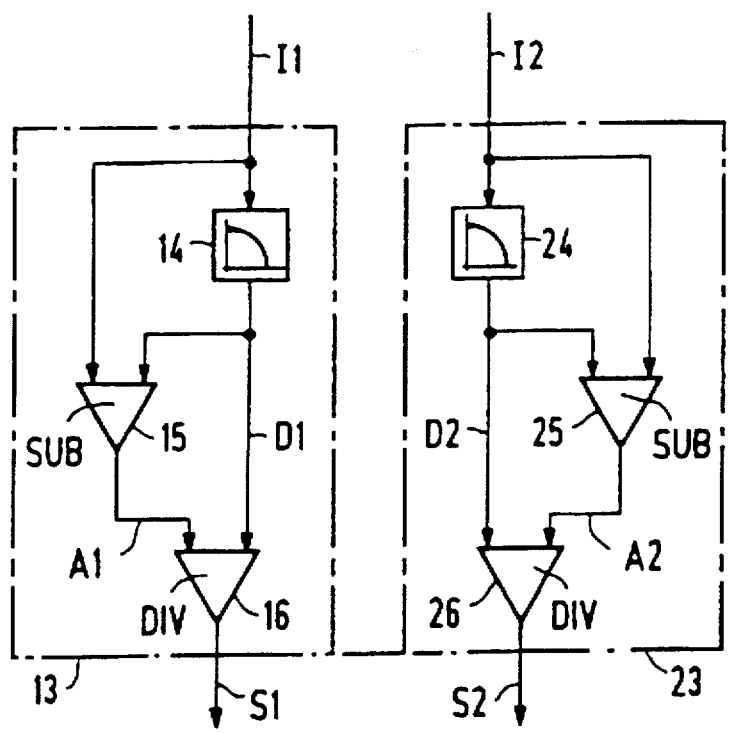
FIG. 2 illustrates schematically one specific embodiment of the normalizing means for such a measuring device.

FIG. 2 shows an advantageous specific embodiment of the normalizing means 13 and 23. The first normalizing means 13 contains a low-pass filter 14 which is electrically connected to the photo-electric transducer 12, a subtractor (SUB) 15, and a divider (DIV) 16. The second normalizing means 23 contains a low-pass filter 24 which is electrically connected to the second photo-electric transducer 22, a subtractor (SUB) 25, and a divider (DIV) 26. Each low-pass filter 14 and 24 allows only a DC signal component D1 or D2 to pass from the intensity signal I1 or I2 applied at its input. At the same time, each DC signal component D1 and D2 of the associated intensity signal I1 or I2 corresponds to the frequency components of the intensity signal I1 or I2 which lie below a predetermined cut-off frequency of the associated low-pass filter 14 or 24. Applied to the two respective inputs of subtractors 15 and 25 are, first of all, the associated intensity signal I1 or I2 and, secondly, the DC signal component D1 or D2 of this intensity signal I1 and I2. Subtractors 15 and 25 form in each case an AC signal component A1 or A2 from the associated intensity signal I1 or I2 by subtracting the DC signal component D1 or D2 from the complete intensity signal I1 and I2. In addition, the cutoff frequencies of both low-pass filters 14 and 24 are selected to be so high that the AC signal components A1 and A2 of the intensity signals I1 and I2 contain essentially all the information about the alternating quantity X to be measured, in, particular the entire frequency spectrum of the alternating electric quantity X. In particular, the cut-off frequency is to be selected to be less than a basic frequency of the alternating quantity X. Low-pass filter 14 or 24 and subtractor 15 or 25 thus form means for decomposing the first intensity signal I1 or second intensity signal I2 into an AC signal component A1 or A2 and a DC signal component D1 and D2 respectively.

Instead of the specific embodiments of these means for decomposition shown in FIG. 2, high-pass filters and low-pass filters for filtering out the AC signal components A1 and A2 or the DC signal components D1 and D2 can also be provided or even, in each case, a high-pass filter for filtering out the AC signal component A1 or A2 and a subtractor for deriving the DC signal component D1=I1−A1 and D2=I2−A2. Mixed forms of these specific embodiments can also be used.

The AC signal component A1 and the DC signal component D1 of the first intensity signal I1 are now fed in each case to an input of divider 16. The first intensity-normalized signal S1=A1/D1 as a quotient of AC signal component A1 and DC signal component D1 of the first intensity signal I1 is then available at an output of divider 16. Likewise, the AC signal component A2 and the DC signal component D2 of the second Intensity signal I2 are fed to the second divider 26, which forms the intensity-normalized signal S2=A2/D2 for the second intensity signal I2. The two intensity-normalized signals S1 and S2 can then be picked off at corresponding outputs of normalizing means 13 or 23.

Figure 3:
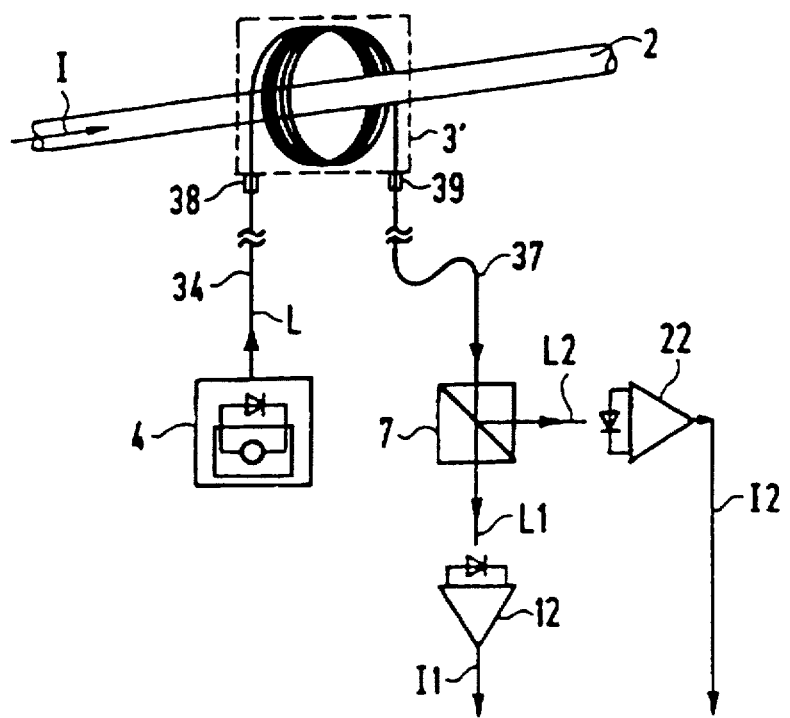
FIG. 3 illustrates schematically a part of a specific embodiment of a device for measuring an electric alternating current and FIG. 4 illustrates schematically a part of a specific embodiment of a device for measuring an electric alternating voltage.

FIG. 3 shows part of a measuring device for measuring an alternating electric current I in a current conductor 2 using at least one Faraday element 3', assigned to current conductor 2 as a sensor device. Linearly polarized measuring light L from a linearly polarized light source 4, for example a laser diode, is coupled into the Faraday element 3' via a preferably polarization-maintaining optical waveguide 34. After passing at least once through the Faraday element 3', the linearly polarized measuring light L is coupled out of the Faraday element 3' again and is fed to analyzer 7 via a preferably polarization maintaining optical waveguide 37. However, the transmission of the measuring light coupled out from the Faraday element 3' to analyzer 7 can also be effected via a free-beam arrangement. Because of the Faraday effect, the measuring light coupled out has a polarization which is rotated by a measuring angle α, not shown. In this case, the measuring angle α is dependent on an alternating electric current I in current conductor 2.

In the specific embodiment shown in FIG. 3, the Faraday element 3' is formed using an optical waveguide, preferably an optical fiber, which surrounds current conductor 2 in a measuring winding having at least one measuring turn. The optical waveguide of the Faraday element 3' is connected to optical waveguide 34 for feeding the measuring light L and to optical waveguide 37 for carrying away the measuring light L, preferably in each case via a splice 38 or 39. However, one or more solid bodies made of a Faraday material, preferably a glass ring, can also be provided as Faraday element 3'. This material forms a light path that preferably surrounds current conductor 2, for the measuring light. The Faraday element 3' does not have to surround current conductor 2 in a closed light path. Instead, Faraday element 3' can also be arranged spatially near, alongside current conductor 2. In addition, apart from the specific embodiment shown of the transmission type, in which the measuring light passes through the Faraday element 3' in only one direction, a specific embodiment of the reflection type is also possible. In this embodiment the measuring light L, after a first passage into the Faraday element 3', is reflected back and passes through the Faraday element 3' a second time in the reverse direction.

The light coupled out of the Faraday element 3' is split by analyzer 7 into two linearly polarized light signals L1 and L2 having planes of polarization which are different and preferably directed at right angles to each other. For this purpose, a polarizing beam splitter such as, for example, a Wollaston prism is preferably provided as analyzer 7. However, two polarizing filters crossed by a corresponding angle, and preferably by 90°, and a simple beam splitter can also be provided for this purpose.

In associated photo-electric transducers 12 and 22, for which photo diodes connected in amplifier circuits are preferably provided, the two light signals L1 and L2 are then converted into electric intensity signals I1 and I2, which are a measure of the light intensities of the respective light signals L1 and L2.

The measuring method and the measuring device according to FIG. 3 can, of course, also be used directly for measuring alternating magnetic fields by arranging the Faraday element 3' in the alternating magnetic field.

Figure 4:
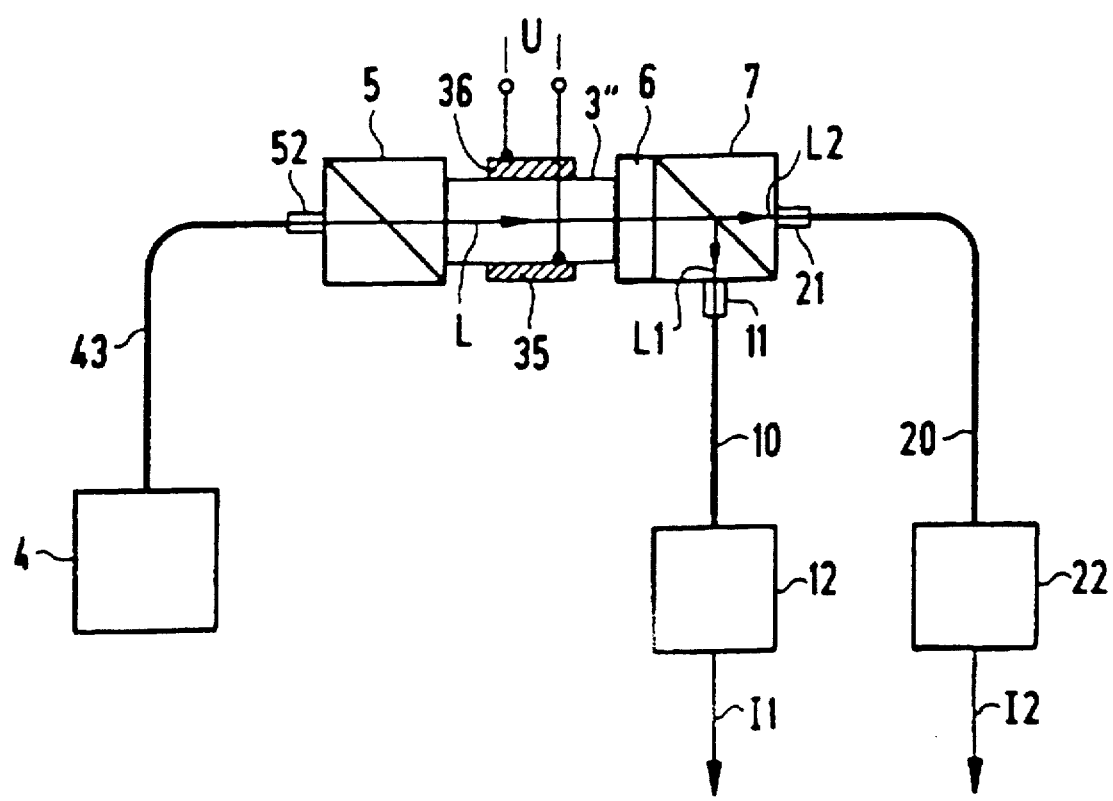

FIG. 4 shows a specific embodiment of part of a device for measuring an alternating electric voltage U as alternating quantity X using a Pockels element 3" as part of a Pockels sensor device. The alternating voltage U to be measured can be applied via two electrodes 35 and 36 to the Pockels element 3". Polarized measuring light L is coupled into the Pockels element 3". This measuring light L passes through the Pockels element 3" and, in so doing, experiences a change in its polarization which is dependent on the applied alternating voltage U. In the specific embodiment shown, the alternating voltage U is applied at right angles to the light propagation direction of the measuring light L (transverse embodiment), but can also be applied parallel to the light propagation direction (longitudinal embodiment). Provided as means for coupling the measuring light L into the Pockels element 3" are a light source 4, for example a light-emitting diode, and a polarizer 5 for the linear polarization of the light from light source 4. Light source 4 and polarizer 5 are preferably optically connected to each other via an optical waveguide 43, for example a multimode optical fiber, but can also be optically coupled to each other by means of a free-beam coupling. To couple the light out of optical waveguide 43 into polarizer 5, a collimator lens (Grin lens) 52 is preferably provided. The measuring light L, which is now linearly polarized, is coupled out of the polarizer 5 into the Pockels element 3". After passing through the Pockels element 3", the measuring light L is fed via a λ/4-plate 6 to analyzer 7. In analyzer 7, the measuring light L is decomposed into two linearly polarized, partial light signals L1 and L2, whose planes of polarization differ from each other. Preferably, the planes of polarization of the two partial light signals L1 and L2 are directed at right angles to each other (orthogonal decomposition). A polarizing beam splitter, for example a Wollaston prism, or even two polarizing filters crossed at a predetermined angle, preferably 90°, and a simple beam splitter can be provided as analyzer 7.

The two partial light signals L1 and L2 are coupled in each case into an optical waveguide 10 or 20, preferably via a collimator lens 11 and 21 respectively, and fed in each case to the associated photo-electric transducer 12 or 22 via this optical waveguide 10 or 20, for example in each case a multimode optical fiber. In the transducers 12 and 22, the two partial light signals L1 and L2 are each converted into an electric intensity signal I1 or I2, which is a measure of the intensity of the associated partial light signal L1 and L2.

Preferably, the operating point of the measuring device is set so that circularly polarized measuring light is present at analyzer 7 when no electric voltage or no electric field is present at the Pockels element 3". The two self-axes of the linear bi-refringence in the Pockels element 3" are in this case "uniformly illuminated" by the measuring light L. This means that the components of the measuring light L projected onto the two self-axes in each case have the same intensity. In general, the two partial light signals L1 and L2 are then equally strong in their intensity. Upon applying an alternating voltage (U≠0V) to the Pockels element 3", the components of the measuring light L along the electrooptically active self-axes of the linear birefringence of the Pockels element 3" are changed in their intensity as a function of the alternating voltage U.

However, such a change in polarization of the measuring light L is also caused by a change of temperature in the Pockels element 3" or in the λ/4-plate 6 and a temperature-dependent linear birefringence caused thereby. Temperature changes thus lead to a shift of the operating point of the measuring device. This temperature-dependent operating-point drift is now largely compensated by the already described temperature-compensation method with the aid of normalizing means 13 and 23, not shown in FIG. 4, and evaluation means 30.

Instead of the optical series circuit, shown in FIG. 4, of the polarizer 5, the Pockels element 3", the λ/4-plate 6, and the analyzer 7, an optical series circuit can also be provided consisting of the polarizer 5, the λ/4-plate 6, the Pockels element 3" and the analyzer 7, that is to say the order of the λ/4-plate 6 and the Pockels element 3" is just exchanged. In this case, the measuring light L is circularly polarized before being coupled into the Pockels element 3".

Furthermore, instead of light source 4 and polarizer 5, a light source for transmitting linearly polarized light, such as, for example, a laser diode, can also be provided for coupling polarized measuring light L into the Pockels element 3" or into the λ/4-plate 6. Optical waveguide 43 is then preferably a polarization-maintaining optical waveguide.

Furthermore, the transmission of the partial light signals L1 and L2 can also be carried out in a free-beam arrangement. Analyzer 7 can, furthermore, be connected optically to the λ/4-plate 6 or to the Pockels element 3" via a polarization-maintaining optical waveguide.

What is claimed is:

1. A method for measuring an alternating electric quantity, comprising:
   a) supplying a polarized measuring light to a sensor device, wherein the sensor device changes a polarization of the polarized measuring light as a function of the alternating electric quantity;
   b) supplying the polarized measuring light to an analyzer, wherein the analyzer splits the polarized measuring light into a plurality of linearly polarized partial light signals, each one of the plurality of linearly polarized partial light signals having a different plane of polarization;
   c) converting each one of the plurality of linearly polarized partial light signals into a corresponding electric intensity signal;
   d) generating for each electric intensity signal a corresponding intensity-normalized signal, each intensity-normalized signal corresponding to a quotient of an AC signal component and a DC signal component of the corresponding electric intensity signal; and
   e) deriving a measured signal for the alternating electric quantity, wherein the measured signal is independent of a system temperature, and wherein the measured signal is derived from the intensity-normalized signals in accordance with the equations:

$$S1 = f1(T)*M \quad (1)$$

$$S2 = f2(T)*M \quad (2)$$

in which M corresponds to the measured signal, T corresponds to the system temperature, f1(T) and f2(T) are each predetermined fit-functions of the system temperature and S1 and S2 correspond to the intensity-normalized signals.

2. The method according to claim 1, wherein fit-functions f1(T) and f2(T) are linear functions of the system temperature.

3. The method according to claim 1, wherein fit-functions f1(T) and f2(T) are quadratic functions of the system temperature.

4. The method according to claim 1, wherein fit-functions f1(T) and f2(T) are exponential functions of the system temperature.

5. The method according to claim 1, further comprising the step of deriving a temperature measured value for the system temperature from the intensity-normalized signals in accordance with the equations (1) and (2).

6. A device for measuring an alternating electric quantity, comprising:
   a) means for supplying a polarized measuring light into a sensor device, wherein the sensor device changes a polarization of the polarized measuring light as a function of the alternating electric quantity;
   b) an analyzer for splitting the polarized measuring light into a plurality of linearly polarized partial light signals, each one of the plurality of linearly polarized partial light signals having a different plane of polarization;
   c) a plurality of photo-electric transducers for converting each one of the linearly polarized partial light signals into a corresponding electric intensity signal;
   d) a plurality of normalizing means for generating for each electric intensity signal a corresponding intensity-normalized signal, each intensity-normalized signal corresponding to a quotient of an AC signal component and a DC signal component of the corresponding electric intensity signal; and
   e) an evaluation means for deriving a measured signal for the alternating electric quantity, wherein the measured signal is independent of a system temperature, and wherein the measured signal is derived from the intensity-normalized signals in accordance with the equations:

$$S1 = f1(T)*M \quad (1)$$

$$S2 = f2(T)*M \quad (2)$$

in which M corresponds to the measured signal, T corresponds to the system temperature, f1(T) and f2(T) are each predetermined fit-functions of the system temperature and S1 and S2 correspond to the intensity-normalized signals.

7. The device according to claim 6, wherein each one of the functions f1(T) and f2(T) comprises one of a linear function and a quadratic function of the system temperature.

8. The device according to claim 6, further comprising a plurality of optical waveguides, each one of the photo-electric transducers being connected to the analyzer through a corresponding one of the optical waveguides.

9. The device according to claim 8, wherein each of the optical waveguides comprise a plurality of multimode fibers.

10. The device according to claims 6, wherein the sensor device and the analyzer are optically connected to each other via a polarization-maintaining optical fiber for transmitting the polarized measuring light out of sensor device.

* * * * *